United States Patent
Tanisaka

(10) Patent No.: US 10,320,144 B2
(45) Date of Patent: Jun. 11, 2019

(54) METHOD FOR MANUFACTURING AN OPTICAL MEMBER AND METHOD FOR MANUFACTURING A SEMICONDUCTOR LASER DEVICE

(71) Applicant: NICHIA CORPORATION, Anan-shi, Tokushima (JP)

(72) Inventor: Shingo Tanisaka, Komatsushima (JP)

(73) Assignee: NICHI CORPORATION, Anan-shi (JP)

( * ) Notice: Subject to any disclaimer, the term of this patent is extended or adjusted under 35 U.S.C. 154(b) by 0 days.

(21) Appl. No.: 15/242,966

(22) Filed: Aug. 22, 2016

(65) Prior Publication Data
US 2017/0063034 A1 Mar. 2, 2017

(30) Foreign Application Priority Data

Aug. 25, 2015 (JP) ................. 2015-165930

(51) Int. Cl.
*H01S 5/022* (2006.01)
*H01S 5/02* (2006.01)
*H01S 3/08* (2006.01)
*H01S 5/20* (2006.01)
(Continued)

(52) U.S. Cl.
CPC ...... *H01S 5/02252* (2013.01); *G02B 19/0052* (2013.01); *H01L 21/67075* (2013.01);
(Continued)

(58) Field of Classification Search
CPC .. H01S 5/02252; H01S 5/2201; H01S 5/0206; H01S 5/02296; H01S 5/2081;
(Continued)

(56) References Cited

U.S. PATENT DOCUMENTS

2002/0048962 A1 4/2002 Sekimura
2005/0110157 A1* 5/2005 Sherrer ................ G02B 6/4201
257/776
(Continued)

FOREIGN PATENT DOCUMENTS

JP 6398501 U 6/1988
JP 2000-077382 A 3/2000
(Continued)

OTHER PUBLICATIONS

JP2009-229809_Eng_Translation_Oct. 8, 2009.*

*Primary Examiner* — Yuanda Zhang
(74) *Attorney, Agent, or Firm* — Global IP Counselors, LLP

(57) ABSTRACT

A method for manufacturing an optical member includes providing a silicon substrate having a first main surface of a {110} plane and a second main surface of a {110} plane that are parallel to each other, forming mask patterns on the first main surface and the second main surface, each of the mask patterns having an opening extending in one direction, so that the opening on a first main surface side and the opening on a second main surface side are disposed alternately, or so that the opening on the second main surface side are disposed directly under the opening on the first main surface side, forming recesses having sloped surfaces in the first main surface side and the second main surface side by wet etching the silicon substrate using the mask patterns as masks, and forming a reflective film on the first main surface or the second main surface.

15 Claims, 8 Drawing Sheets

(51) Int. Cl.
*H01L 21/67* (2006.01)
*H01S 5/22* (2006.01)
*G02B 19/00* (2006.01)
*H01S 5/00* (2006.01)

(52) U.S. Cl.
CPC ........ *H01S 3/08059* (2013.01); *H01S 5/0201* (2013.01); *H01S 5/0203* (2013.01); *H01S 5/0206* (2013.01); *H01S 5/02296* (2013.01); *H01S 5/2081* (2013.01); *H01S 5/2201* (2013.01); *H01S 5/0071* (2013.01); *H01S 5/02212* (2013.01)

(58) Field of Classification Search
CPC .. H01S 5/0203; H01S 3/08059; H01S 5/0201; H01S 5/0071; H01S 5/02212; H01L 21/67075; G02B 19/0052
See application file for complete search history.

(56) References Cited

U.S. PATENT DOCUMENTS

| | | | |
|---|---|---|---|
| 2005/0169570 A1 | 8/2005 | Kim et al. | |
| 2010/0051944 A1 | 3/2010 | Kato et al. | |
| 2010/0226655 A1* | 9/2010 | Kim | G02B 6/4246 398/139 |
| 2011/0049554 A1 | 3/2011 | Wu et al. | |
| 2014/0082947 A1* | 3/2014 | Phatak | C30B 29/20 30/345 |

FOREIGN PATENT DOCUMENTS

| | | |
|---|---|---|
| JP | 2005-203782 A | 7/2005 |
| JP | 2006-086492 A | 3/2006 |
| JP | 2006-216832 A | 8/2006 |
| JP | 2009-526390 A | 7/2009 |
| JP | 2009-229809 A | 10/2009 |
| JP | 2010-056379 A | 3/2010 |
| JP | 2010-522349 A | 7/2010 |
| JP | 2011-049562 A | 3/2011 |
| JP | 2011-088107 A | 5/2011 |
| JP | 2015-515113 A | 5/2015 |
| JP | 2015-530161 A | 10/2015 |
| WO | 2007-090856 A1 | 8/2007 |
| WO | 2008-114991 A1 | 9/2008 |
| WO | 2013-106285 A2 | 7/2013 |
| WO | 2014-052296 A1 | 4/2014 |

* cited by examiner

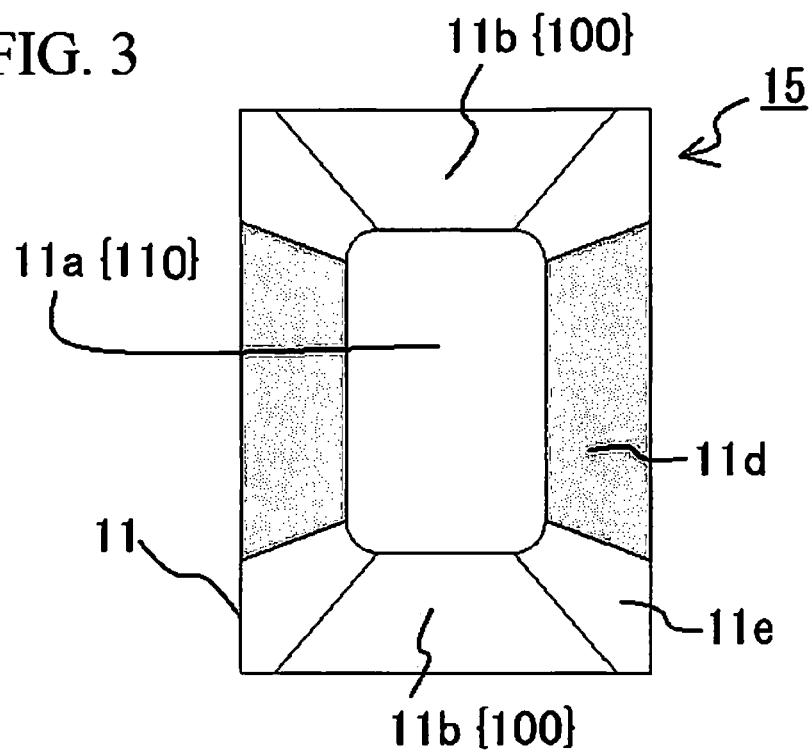

METHOD FOR MANUFACTURING AN OPTICAL MEMBER AND METHOD FOR MANUFACTURING A SEMICONDUCTOR LASER DEVICE

CROSS-REFERENCE TO RELATED APPLICATIONS

This application claims priority to Japanese Patent Application No. 2015-165930 filed on Aug. 25, 2015. The entire disclosure of Japanese Patent Application No. 2015-165930 is hereby incorporated herein by reference.

BACKGROUND

1. Technical Field

The present disclosure relates to a method for manufacturing an optical member, a method for manufacturing a semiconductor laser device and a semiconductor laser device.

2. Description of Related Art

There has been a need in recent years for making packages smaller and higher in output in the optical field, and especially with semiconductor lasers. To this end, there has been proposed a semiconductor laser device in which one or more laser elements and optical members, such as an optical member having a 45-degree sloped surface, are disposed in a single package, and the laser light that has been reflected perpendicularly is collimated with a lens. Also, in an effort to supply an inexpensive optical member having a 45-degree sloped surface, there has been proposed a method for manufacturing an optical member having a 45-degree sloped surface in which silicon is used and subjected to wet etching (for example, JP2000-77382A, JP2006-86492A and JP2010-522349A).

However, it is not easy to achieve both flatness and good angular precision of the 45-degree sloped surface. Also, no method has yet been established with which such a mirror can be manufactured by a simple method, and there has been a need for a method in which an optical member equipped with a sloped surface with a high degree of flatness can be manufactured by a simple method. Also, there has been a need for a method for suitably mounting such an optical member by a simple method.

SUMMARY

The following inventions are disclosed in the present disclosure.

(1) A method for manufacturing an optical member includes providing a silicon substrate having a first main surface of a $\{110\}$ plane and a second main surface of a $\{110\}$ plane that are parallel to each other, forming mask patterns on the first main surface and the second main surface, each of the mask patterns having an opening extending in one direction, so that the opening on a first main surface side and the opening on a second main surface side are disposed alternately, or so that the opening on the second main surface side are disposed directly under the opening on the first main surface side, forming recesses having sloped surfaces in the first main surface side and the second main surface side by wet etching the silicon substrate using the mask patterns as masks, and forming a reflective film on the first main surface or the second main surface.

(2) A method for manufacturing a semiconductor laser device includes manufacturing an optical member by the method described above, and fixing the optical member and a semiconductor laser element to a mounting board so that laser light emitted from the semiconductor laser element is irradiated to the reflective film of the optical member.

(3) A semiconductor laser device has a mounting board, a semiconductor laser element provided on the mounting board, and an optical member made of silicon having a first $\{110\}$ plane, a first $\{100\}$ plane that is adjacent to the first $\{110\}$ plane, a second $\{110\}$ plane, and a second $\{100\}$ plane that is adjacent to the second $\{110\}$ plane, with the second $\{100\}$ plane being fixed on the mounting board, and the first $\{110\}$ plane being covered by a reflective film to reflect laser light emitted from the semiconductor laser element.

According to one embodiment of the present disclosure, an optical member that includes a good-quality reflective film on a main surface with high flatness, and that is easy to handle can be simply and precisely manufactured, and a semiconductor laser device including the optical member can be manufactured. According to one embodiment of the present disclosure, a semiconductor laser device including a high-precision optical member can be provided.

BRIEF DESCRIPTION OF DRAWINGS

FIG. 3 is a schematic plan view illustrating a surface of the optical member obtained with the method in FIGS. 2A to 2D;

DETAILED DESCRIPTION OF EMBODIMENTS

Figure 1A:
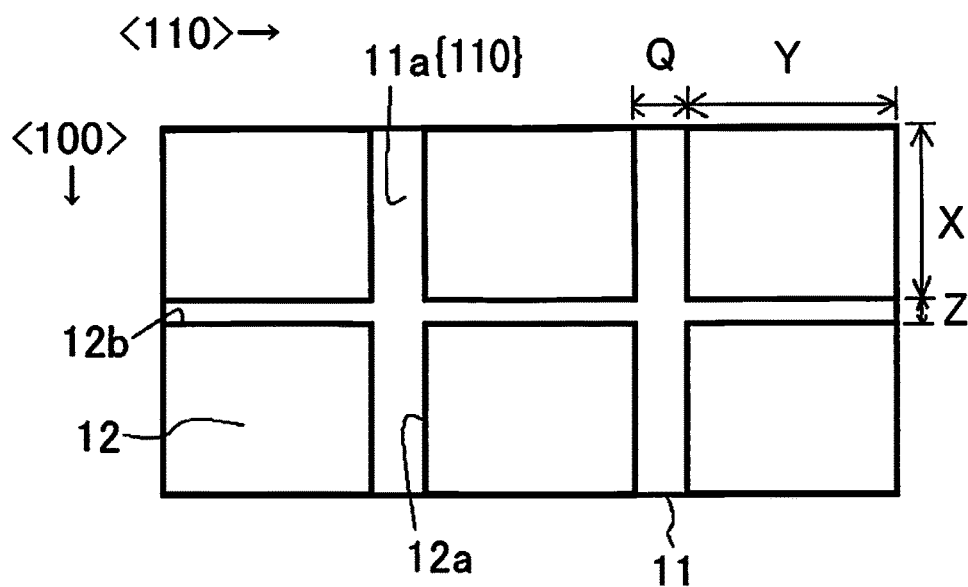
FIG. 1A and FIG. 1B are a schematic plan view and a schematic cross section, respectively, illustrating an embodiment of mask patterns on a silicon substrate in the present disclosure.

Embodiments of the present invention will be described below with reference to the accompanying drawings. In the following embodiments of the methods and the semiconductor laser devices that embody the technological concept of the present invention are just examples, and unless otherwise specified, the constituent parts discussed in the embodiments are not intended to limit the scope of the present invention. Further, constitutions described in examples and the embodiments can be employed in other examples and embodiments. The sizes and the arrangement relationships of the members in each of drawings are occasionally shown exaggerated for ease of explanation.

Embodiment 1: Method for Manufacturing an Optical Member

A method for manufacturing an optical member of this embodiment includes (a) providing a silicon substrate having a first main surface and a second main surface of a {110} plane that are parallel to each other;

(b) forming mask patterns on the first main surface and second main surface, each of the mask patterns having an opening extending in one direction, so that the opening on the first main surface side and the opening on the second main surface side are disposed alternately, or so that the opening on the second main surface side are disposed directly under the opening on the first main surface side;

(c) forming recesses having sloped surfaces in the first main surface side and the second main surface side by wet etching the silicon substrate using the mask patterns as masks; and (d) forming a reflective film on the first main surface or the second main surface.

a: Providing of Silicon Substrate

A silicon substrate is prepared. The silicon substrate has a first main surface and a second main surface that are composed of {110} planes and parallel to each other. The second main surface of the silicon substrate refers to the main surface on the opposite side from the first main surface. Here, "{110} plane" refers to one (110) plane out of the crystal lattice planes in a diamond structure of silicon, which is crystal structure of silicon that is stable at normal temperature and pressure, and to all equivalent crystal planes. "Equivalent crystal planes" means the family of equivalent crystal planes or facets defined by the Miller index. The first main surface and/or the second main surface of the silicon substrate is permitted to have an off angle of about ±2 degrees from the {110} plane. The off angle is preferably within a range of ±1 degree, and more preferably within a range of ±0.2 degree.

The size and thickness of the silicon substrate can be suitably adjusted as dictated by the intended application of the optical member to be obtained, for example. It is preferable to obtain a plurality of optical members from a single silicon substrate, and to this end the silicon substrate may have a length and/or width of from a few centimeters to a few dozen centimeters.

The silicon substrate is preferably of uniform thickness, but may have a portion where the thickness is different. The thickness of the silicon substrate can be, for example, from 100 μm to a few thousand microns, such as a range of 500 to 2000 μm.

b: Formation of Mask Patterns

Mask patterns are formed on each of the first main surface and second main surface of the silicon substrate. Each of the mask patterns has an opening. The term the "opening" here means an opening that extends in one direction. There may be just one opening in each main surface, or there may be two or more. In any case, it is preferable for the openings in the first main surface and the second main surface to be parallel to each other.

The mask patterns are preferably formed so that the opening on the first main surface side and the opening on the second main surface side are disposed alternately (i.e., the opening on the first main surface side and the opening on the second main surface side do not overlap each other in plan view), or so that the opening on the second main surface side is located directly under the opening on the first main surface side (i.e., the opening on the first main surface side and the opening on the second main surface side overlap each other in plan view).

The shape and size of the openings and the direction in which they extend can be set as needed.

Figure 1B:
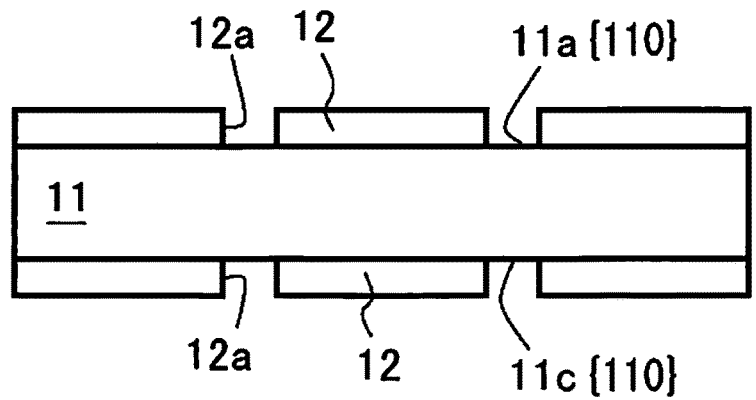

Examples of the direction in which the openings extend include the <100> direction, the <111> direction, and the <112> direction. As shown in FIGS. 1A and 1B, the <100> direction is particularly preferable. Using the <100> direction as the direction in which the openings extend makes it easy to obtain 45-degree sloped surfaces. Also, the openings can extend in a direction parallel to the first main surface and/or the second main surface.

Here, the "<100> direction" refers to a direction perpendicular to the (100) plane, which is one of the crystal lattice planes in a diamond structure, which is crystal structure of silicon that is stable at normal temperature and pressure, and to all directions that are perpendicular to equivalent crystal planes.

The shape of the openings is preferably striped. As long as one opening extends in one direction, the one opening may be linked to the other opening extending in the other direction that intersects the one opening. For example, the openings extending in the <100> direction may link to openings extending in the <110> direction to form a lattice pattern or an intersecting shape. The openings extending in the <100> direction has outer edges (both sides) that are preferably parallel to the <100> direction. Also, the openings extending in the <110> direction has outer edges (both sides) that are preferably parallel to the <110> direction.

The length of the opening extending in one direction can be suitably set according to the size of the silicon substrate being used. The width of the opening extending in one direction can be suitably set according to the height of the sloped surfaces to be obtained in a subsequent step, etc. An example of the width of the opening is about 200 to 1000 μm. The width of each of the openings may be the same or different between the opening on the first main surface side and the opening on the second main surface side. The less is the width of the opening, the greater is the surface area of the main surface remaining after etching. Therefore, the surface area of the main surface with the smaller width of opening can be kept large by making the opening width be different on the first main surface side and the second main surface side. Stable mounting can be achieved by using this larger main surface as the optical member mounting surface. On the other hand, the effective reflecting surface area of the optical member can be increased by using the larger main surface as the surface on which the reflective film is formed.

As discussed above, the mask pattern may have an opening extending in one direction (such as the <100> direction), as well as an opening extending in a different direction (such as the <110> direction). In the case that there is the opening extending in some other direction, this width may be the same as or different from the width of the opening extending in the one direction. The sloped surfaces formed by the opening extending in some other direction are not related to the function of the optical member. Thus, the width of the opening extending in some other direction is preferably less than the width of the opening extending in the one direction. This allows the surface area of the silicon substrate to be used more effectively. Also, the opening extending in some other direction can be used as grooves for division. In this case, it is preferable for the opening in some other direction to be somewhat wider, such as about 50 to 500 μm.

The depth of the opening corresponds to the thickness of the mask pattern, and is about 0.1 to 1 μm, for example.

The spacing of adjacent openings can be set as desired, according to the intended size of the optical member. In the case that the mask patterns are formed so that the opening on the second main surface side is located directly under the opening on the first main surface side, the spacing of adjacent openings is about 200 to 1000 μm, for example. In this case, the mask patterns are preferably formed so that, when viewed from the first main surface side, the center line along the direction in which the opening on the second main surface side extend is located within the opening on the first main surface side. More preferably, the mask patterns are formed so that the center line along the direction in which the opening on the first main surface side extend coincides with the center line along the direction in which the opening on the second main surface side extend in plan view. For example, the center line of the opening along the <100> direction on the first main surface side preferably coincides with the center line of the opening along the <100> direction on the second main surface side in plan view. This layout makes it easier to match up the lower ends of the recesses having sloped surfaces formed by etching (discussed below). Consequently, when the lower ends of the recesses are used as the division points, the division can be made perpendicular to the first main surface, which makes the division easier.

In the case that the mask patterns are formed so that the opening on the first main surface side and the opening on the second main surface side are located alternately, the spacing between the opening on the second main surface side adjacent to the opening on the first main surface side, in a see-through view, is about 200 to 1000 μm, for example.

The mask patterns can usually be formed by a known method and from materials known in this field, such as forming a resist film or an insulating film (an oxide film or nitride film of silicon, hafnium, zirconium, aluminum, titanium, lanthanum, or the like, or a composed film of these, etc.), and forming by means of photolithography and etching steps. It is particularly preferable for the material of the mask patterns to be suitably selected according to the type of etchant used in the wet etching (discussed below).

The openings extending in some other direction may be formed on both the first main surface and the second main surface of the silicon substrate, but also may be formed on just the first main surface or the second main surface of the silicon substrate.

c: Formation of Recesses Having Sloped Surfaces

The silicon substrate is subjected to wet etching using the mask patterns as masks. This wet etching may be performed first on the first main surface and then on the second main surface, but it is preferable to perform wet etching simultaneously on both the first main surface and the second main surface sides. This forms recesses having sloped surfaces on both the first main surface and the second main surface sides. Etching from both sides makes division of the silicon substrate (discussed below) easier.

The sloped surfaces may be any crystal plane. The shape of the recesses in cross sectional view may be U-shaped, V-shaped, one of these shapes in which the corners are rounded, or the like.

It is especially preferable to form sloped surfaces having a {100} plane. The sloped surfaces are preferably surfaces extending in the <100> direction and having an angle of inclination of 45 degrees to the first main surface and second main surface (that is, the {110} plane) of the silicon substrate. In other words, the sloped surfaces preferably form an angle of 135 degrees to the first main surface of the silicon substrate. However, the {100} plane here is permitted to have an off angle of about ±2 degrees with respect to the {100} plane, and thus the sloped surfaces may be surfaces having an inclination angle of about 45±2 degrees to the second main surface. The off angle is preferably within a range of ±1 degree, and more preferably within a range of ±0.2 degree.

The etching is preferably wet etching, but any other etching method that allows anisotropic etching to be performed may be employed.

The wet etching may be performed under any conditions so long as the above-mentioned mask patterns are used as the masks and an etchant that allows for anisotropic etching is used. Examples of the etchant includes tetramethylammonium hydroxide (TMAH), potassium hydroxide, sodium hydroxide, ethylene diamine pyrocatechol (EDP), hydrazine or a solution mixture prepared by adding isopropanol to, or mixtures thereof. The concentration of the etchant can be suitably set after taking into account the etching rate of the silicon substrate and so forth. The use of TMAH is particularly preferable. This is because TMAH has higher anisotropy in the etching of a {110} plane silicon substrate than other anisotropic etchants, and sloped surfaces that are sloped by approximately 45 degrees from the main surface can be formed on a {110} plane silicon substrate with a high degree of accuracy. TMAH is also preferable because it is easy to handle.

As to the etching conditions, when the etchant is TMAH, for example, the temperature of the etchant is set to between 80 and 110 degrees centigrade, and immersion is performed for about 2 to 10 hours. The immersion time may be adjusted to obtain the desired amount of etching.

Figure 8A:
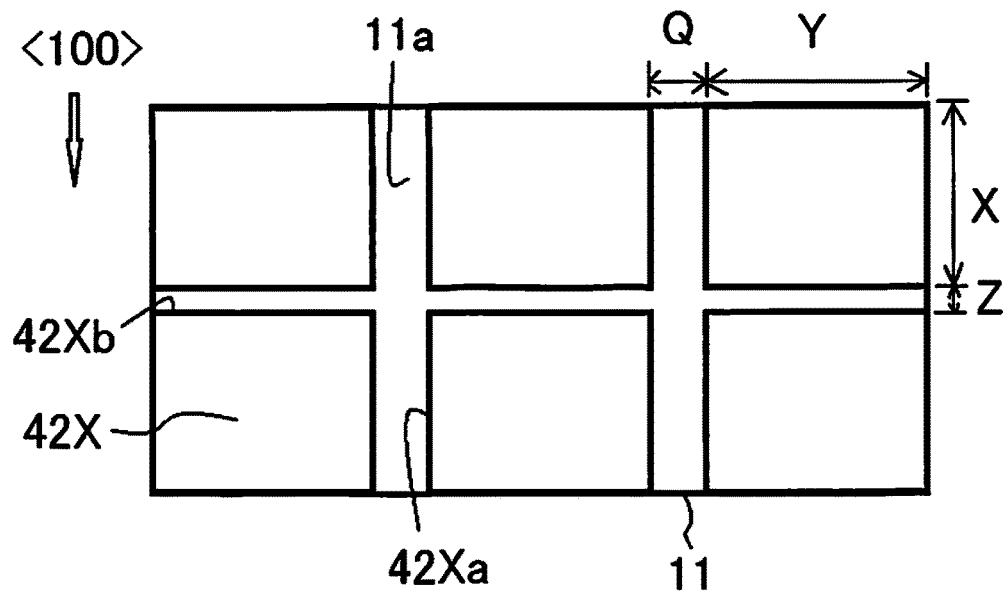
FIG. 8A and FIG. 8B are a schematic plan view and a schematic cross sectional view, respectively, illustrating an embodiment of mask patterns on a silicon substrate in another method for manufacturing an optical member in the present disclosure.
Figure 8B:
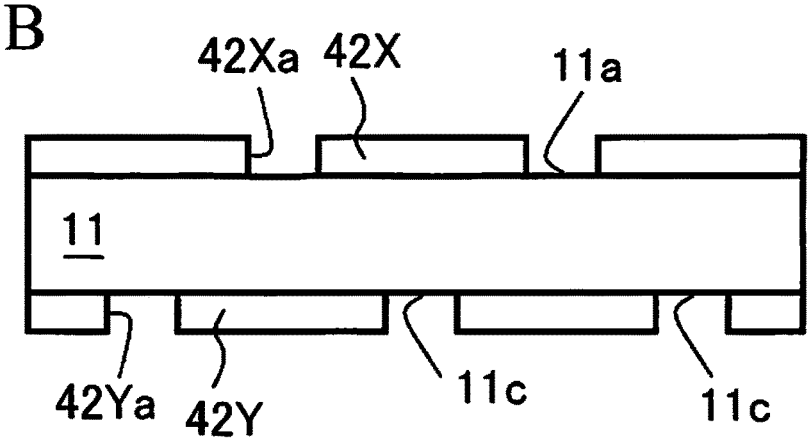
Figure 8C:
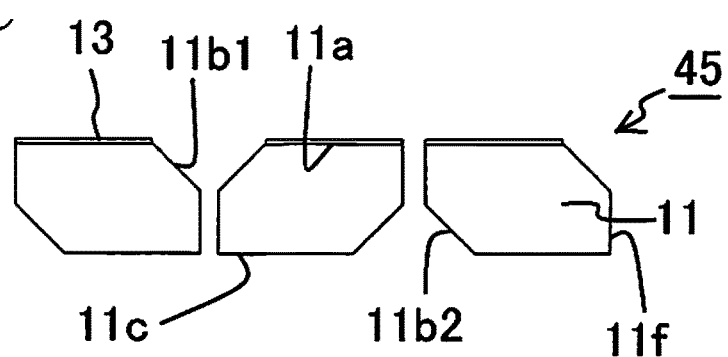
FIG. 8C is a schematic cross sectional view of the optical member thus obtained.

In the case that the opening extending in the <110> direction is formed in the mask pattern used here, the sloped surfaces that are formed will be the {111} plane, and will be faces having an angle of inclination of about 35 degrees (see 11d in FIGS. 8A to 8C). The angle here is also permitted to have an off angle of about ±2 degrees to the {110} plane.

In the case that the etching is further continued after these sloped surfaces have been formed, the cross sectional shape formed by the sloped surfaces from opposing sides will become trapezoidal, and further etching will form V-shaped grooves. When trapezoidal, and preferably V-shaped, grooves are formed, division (discussed below) will be easier at the bottom of the V, so etching is preferably continued until V-shaped grooves are formed. For instance, when each of mask patterns is used that has openings in the <100> direction and the <110> direction as discussed above, the silicon substrate will cleave in neither the <100> direction nor the <110> direction, so it is preferable to use the V-shaped grooves as the starting point for the division. In particular, when the mask patterns are formed so that the opening on the second main surface side is located directly under the opening on the first main surface side, the lower ends of the V-shaped grooves produced by the sloped surfaces etched from the first main surface side and the second main surface side will be close together, but it is preferable not to etch to the extent that the lower ends link up. In forming a reflective film in a subsequent step, the silicon substrate can be handled in a wafer unit, and forming the reflective film all at once simplifies the process.

Alternatively, when the mask patterns are formed so that the opening on the second main surface side is located directly under the opening on the first main surface side, etching may be performed until the sloped surfaces etched from the first main surface side and the second main surface side are linked. This makes it possible to omit the division at the recesses of the silicon substrate (discussed below). In particular, as will be discussed below, forming a reflective film on the first main surface or the second main surface is effective when performed before the formation of the mask patterns in step (b) and the formation of the recesses having sloped surfaces in step (c).

The sloped surfaces are preferably formed to a depth of about a few hundred microns to one thousand and some hundreds microns, and particularly about 200 to 1000 µm, for example, from the first main surface of the silicon substrate.

In the case that a silicon substrate is used that has a first main surface of a {110} plane and a second main surface of a {110} plane that are parallel to each other, then no matter in which direction the openings of the mask patterns extend, ultimately recesses having two sloped surfaces whose cross sectional shapes are in line symmetry can be formed. Consequently, as will be discussed below, it is possible to form surfaces that are flat and horizontal, with which the divided silicon substrate and optical members can be easily picked up with a suction apparatus or the like.

d: Formation of Reflective Film

A reflective film is formed on the first main surface or second main surface of the silicon substrate. In the case that the reflective film is formed on the sloped surfaces, it will be formed at the angle by which those surfaces are inclined, so there is the risk that it may be hard to control the film thickness, but this problem can be avoided by forming the reflective film on the first main surface or the second main surface.

The reflective film can be formed from a material capable of reflecting at least 50% of the light from the semiconductor laser element, for example. In other words, the reflective film can have a reflectance of at least 50% at the emission wavelength of the semiconductor laser element. When combined with a high-output semiconductor laser element (such as one with a light output of at least 1 W), this film is preferably formed from a material capable of reflecting at least 80%, and forming it from a material capable of reflecting at least 90%, or at least 95%, is more preferable. Examples include a single-layer or laminate-structure film of gold, silver, copper, iron, nickel, chromium, aluminum, titanium, tantalum, tungsten, cobalt, ruthenium, tin, zinc, lead, and other such metals, as well as alloys of these (for instance, examples of aluminum alloys include alloys of aluminum and copper, silver, platinum, or other such platinum family metals). When the reflective film is made of a metal, then a single-layer film of aluminum, gold, silver, or chromium is particularly preferable.

The reflective film may be a dielectric multilayer film in which two or more types of dielectric are laminated, etc. A preferable dielectric multilayer film is a DBR (distributed Bragg reflector) film. Examples of the dielectric film composing the DBR film include an oxide or nitride film containing at least one element selected from the group including of silicon, titanium, zinc, niobium, tantalum and aluminum. Among them, a multilayer structure of the oxide film of silicon, zinc, niobium, tantalum and aluminum is preferable. The first layer of the reflective film preferably has good adhesion to silicon. For instance, $SiO_2$ or another such silicon-containing layer is believed to be suitable. The desired reflectivity can be obtained by adjusting the material and thickness of the various layers of the dielectric multilayer film.

It is particularly preferable for the reflective film to be formed by a dielectric multilayer film. Compared to a reflective film composed of a metal, a dielectric multilayer film has high reflectivity with respect to the emission wavelength of the laser. That is, a reflectivity of close to 100% can be achieved. Consequently, an optical member with low optical absorption, that is, little heat generation, can be obtained. As a result, a high-output semiconductor laser device can be obtained. Since the reflectivity of a dielectric multilayer film varies when the thickness of each layer changes, it is preferable to form the film perpendicular to the formation surface in wafer state so that the film can be formed in the designed thickness. Therefore, the dielectric multilayer film is more preferably formed on the first main surface or the second main surface (the {110} plane) of the silicon substrate.

The thickness of the reflective film is, for example, from about a few tenths of a micron to a few dozen microns, with about 0.1 to 10 µm being preferable, and about 0.3 to 7 µm being more preferable.

The reflective film can be formed by a known method such as vacuum deposition method, ion plating method, ion vapor deposition (IVD), sputtering, ECR sputtering, plasma deposition, chemical vapor deposition (CVD), ECR-CVD method, ECR-plasma CVD Law, electron beam evaporation (EB) method and atomic layer deposition (ALD) method. Regardless of how the film is formed, it is preferably formed perpendicular to the formation surface.

A reflective film that has excellent angular accuracy, flatness, etc., and has good film quality in its reflecting function can be formed by forming the reflective film on the first main surface or second main surface that is composed of a {110} plane. As a result, the reflection efficiency and durability of the optical member can be enhanced. Also, an optical member can be manufactured simply, easily, accurately, and efficiently. Furthermore, the manufacturing cost for the optical member itself can be reduced.

As long as the quality of the reflective film is not compromised, the formation of the reflective film on the first main surface or the second main surface may be performed before the formation of the mask patterns in step (b) or the formation of the recesses having sloped surfaces in step (c). In performing wet etching, in the case where the reflective film is in a state of being protected by the mask patterns, this will prevent degradation of the reflective film quality by the wet etching. The mask patterns are removed after the wet etching.

e: Division of Silicon Substrate

The silicon substrate is preferably divided in the recesses. As long as the division is performed after the recesses have been formed, it may be performed either before or after the formation of the reflective film. To simplify the process, preferably the reflective film is formed all at once in a wafer unit, after which the division is performed.

The division of the silicon substrate is preferably performed along the sloped surfaces (that is, along one direction). For example, it is preferably performed in a direction along the 45-degree sloped surfaces, such as in the <100> direction. As discussed above, when sloped surfaces are formed on the silicon substrate, recesses, such as grooves with a trapezoidal or V-shaped cross section, are formed by one sloped surface or two sloped surfaces. Accordingly, it is preferable to divide in the recesses, such as in trapezoidal or V-shaped grooves, so that the division runs long these recesses or grooves. It is particularly preferable to divide along the lower ends of the V-shaped grooves. Since there are a number of openings in each of the mask patterns on the first main surface and the second main surface, dividing in this way allows the formation of optical members having two sloped surfaces.

In particular, in the case that the mask patterns are formed by the above process so that the opening on the second main surface side is located directly under the opening on the first main surface side, the lower ends of the recesses from both main surfaces will substantially coincide, so the division can be performed more accurately and straightly.

In the case that the etching is performed by forming mask patterns having openings extending in two directions as discussed above, division in two directions can be performed simply and accurately by using recesses produced by this etching for the division. The two directions are, for example, the <100> direction and the <110> direction.

Regardless of whether or not there is etching in a direction extending in the above-mentioned <110> direction, the division is preferably performed in a direction perpendicular to the direction along the sloped surfaces, such as in the <110> direction. The division here may make use of grooves produced by etching in a direction extending in the <110> direction, or may make use of division-assisting grooves or cracks, as will be discussed below.

In the division of the silicon substrate, division-assisting grooves and/or cracks are preferably formed and the substrate divided along them. These division-assisting grooves and/or cracks can be made by blade dicing, laser dicing, or another such known method. In particular, the use of laser dicing is preferable because it allows for internal working of the material. This allows cracks to be formed over substantially the entire surface, regardless of how thick the material is, and suppresses the generation of debris during division. When laser dicing that allows internal working is used, a laser dicing apparatus emits an internal working laser beam, forming cracks directly under the V-shaped grooves, after which these are used as the starting points to divide the silicon substrate with a breaker.

The size of the silicon substrate after division can be set as needed. For example, one side may measure 2.0 mm and the other side 1.0 mm. The side in the <110> direction is preferably 2.0 mm, and the side in the <100> direction 1.0 mm.

EXAMPLE 2

Semiconductor Laser Device

Figure 4A:
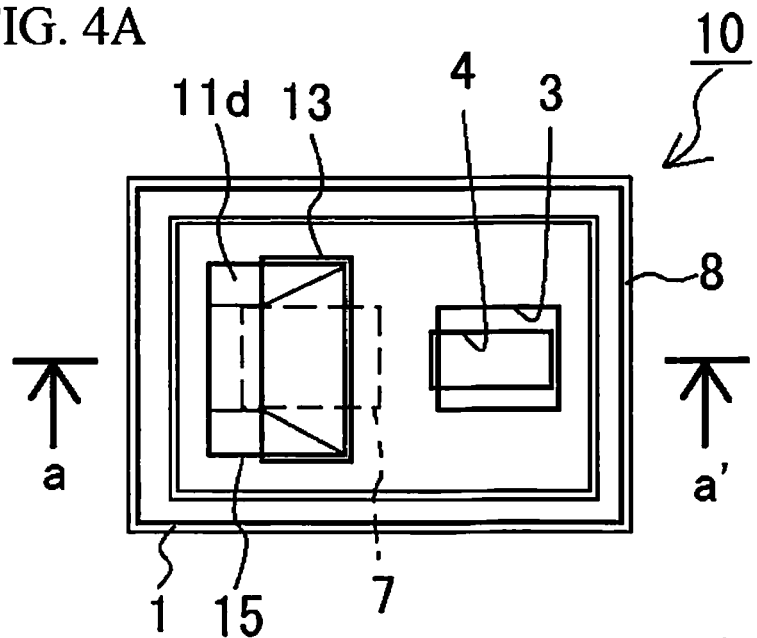
FIG. 4A and FIG. 4B are a schematic plan view and an a-a' line schematic cross sectional view, respectively, illustrating an embodiment of a semiconductor laser device in the present disclosure.
Figure 4B:
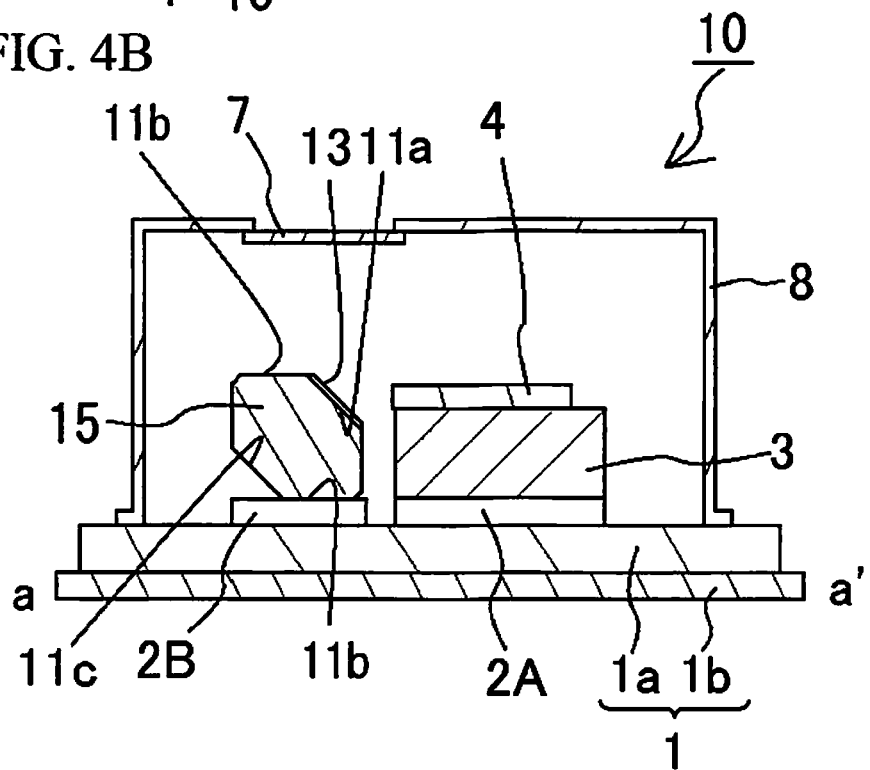

A semiconductor laser device of this embodiment has, as shown in FIGS. 4A and 4B, a mounting board 1, a semiconductor laser element 4 provided on the mounting board 1 and an optical member 15 that is composed of silicon having a first {110} plane 11a, a first {100} plane 11b that is adjacent to the first {110} plane 11a, a second {110} plane 11c, and a second {100} plane 11b that is adjacent to the second {110} plane 11c. The second {100} plane 11b of the optical member 15 is fixed on the mounting board, the first {110} plane of the optical member 15 is covered by a reflective film 13. The optical member 15 is disposed at a position that allows laser light emitted from the semiconductor laser element 4 to be reflected.

Optical Member 15

The optical member 15 is a member that reflects the laser light emitted from a semiconductor laser element 4 in the intended direction. The optical member 15 is preferably composed of silicon (Si). Silicon has higher thermal conductivity than a conventional optical member composed of quartz (called a prism), so it is particularly advantageous with a high-output laser in which the output of the semiconductor laser element is 1 W or higher.

The optical member preferably has a {110} plane and a {100} plane of silicon. There are preferably two or more of each of these {110} plane and {100} plane. That is, the laser reflecting surface of the optical member 15 is preferably the {110} plane. The member may also have other planes. The {110} plane and {100} plane here are intended to permit inclination due to an off angle of about ±2 degrees. Furthermore, it is preferable that the {100} plane is fixed on a mounting board, and the {110} plane is covered by a reflective film. Thus forming a reflective film on the {110} plane allows for easy and accurate control of the film thickness, and allows a reflective film of good quality to be formed. The {100} plane here can be a plane that is at an angle of 45 degrees to the {110} plane.

The {110} plane corresponds to the first main surface and second main surface of the silicon substrate in the above-mentioned method for manufacturing an optical member, for example, and the {100} plane is a sloped surface formed by etching using a mask pattern having an opening that extend in the <100> direction.

The optical member 15 may be usually one in which the {110} plane serving as the reflecting surface is covered by a reflective film as discussed above.

The optical member 15 is disposed opposite the semiconductor laser element 4. The opposing disposition in this case means that the optical member 15 is disposed opposite the optical member 15, on the reflecting surface of the optical member 15, that is, on the surface covered by the reflective film, at a position that is illuminated with the laser light emitted from the semiconductor laser element 4 and at which this light can be reflected. More specifically, the optical member 15 is disposed so that the reflecting surface of the optical member 15 is located on an extension of the light waveguide area, on the light emission surface side of the semiconductor laser element 4. For example, it is disposed so that the reflecting surface of the optical member is inclined with respect to the end of the semiconductor laser element on the optical member side. This reflecting surface reflects the laser light, and allows the optical axis of the laser light emitted from the semiconductor laser element 4 to be turned. In the case where the laser light from the semiconductor laser element is emitted parallel to the main surfaces of the mounting board, then the angle formed by the sloped surfaces and the main surfaces of the mounting board is 45±2 degrees, and preferably 45±1 degree, and more preferably 45±0.2 degree. This allows the light from the semiconductor laser element to move forward in a direction that is perpendicular to the mounting board 1.

As discussed above, with the optical member 15, the first main surface or the second main surface serves as a reflecting surface, which allows a surface adjacent to this reflecting surface, such as the {100} plane, to be parallel to the surface of the mounting board 1, that is, to be a horizontal surface. Accordingly, using this surface improves handling properties. For example, it can be picked up easily with any suction apparatus or the like that is commonly used in this field.

As long as it has the above-mentioned reflecting surface, and preferably as long as it has a mounting surface and a surface that is parallel thereto and that contributes to improving handling, the optical member 15 can have any of various shapes. Examples include a polyhedral column, a truncated pyramid, and shapes that are a combination of these. The optical member 15 may have sloped surfaces that are inclined to the {110} plane (see 11d in FIGS. 8A to 8C). The inclination angle of these sloped surfaces to the {110} plane is less than the inclination angle of the {100} plane to the {110} plane, and is about 35 degrees, for example.

With the optical member 15, the reflecting surface is preferably disposed within about 10 to 150 μm from the semiconductor laser element, for example, and more preferably within about 20 to 100 μm.

Just one optical member 15 may be disposed on the mounting board, or a plurality of them may be disposed. In the latter case, they are preferably disposed in a matrix, for example. Also, one optical member 15 may be disposed for each semiconductor laser element, or just one may be disposed for a plurality of semiconductor laser elements.

The optical member 15 is usually disposed on the mounting board 1 via a metal layer and/or an adhesive member. The metal layer may be disposed over a surface area less than the surface area and/or the fixing surface of the optical member 15, or may be disposed on the same surface area. Also, this layer may be disposed sticking out from the edges of the fixing surface of the optical member 15. This ensures a heat dissipation path for the optical member 15.

The metal layer may be formed by a single layer of gold, silver, aluminum, or another such metal, or by a laminate that includes these. More specifically, examples include Ti/Pt/Au, Ni/Au, Ni/Pd/Au, Ni/Pd/Au/Pd, and other such laminates. In the case that the outermost surface of the metal layer is gold, all of part of this gold may diffuse into the adhesive member (discussed below), such as a gold-based solder. In this case, the diffused gold will function as an adhesive member. The metal layer can be formed by vapor deposition, sputtering, plating, or another such method that is known in this field. Sputtering can be used to particular advantage.

Example of the adhesive member include those made of a metal material such as Au-based solder material (AuSn-based solder, AuGe-based solder, AuSi-based solder, AuNi-based solder, AuPdNi based solder, etc.) and Ag-based solder material (AgSn based solder). When an adhesive member is used, the bonding surfaces of the optical member and the mounting board or metal layer are put together with the adhesive member in between, after which they are held together at a specific temperature and pressure. For instance, thermocompression bonding can be used. From the standpoint of heat dissipation, the adhesive member is preferably disposed over the entire surface between the optical member and the mounting board or metal layer. A UV curing adhesive, a thermosetting adhesive, or another such adhesive agent may also be used.

Mounting Board 1

The semiconductor laser element 4, the optical member 15, and so forth that make up the semiconductor laser device are placed on the mounting board 1. The mounting board 1 is also used to allow heat generated by the semiconductor laser element 4 to be efficiently released to the outside. The mounting board 1 is typically composed of an insulating ceramic. AlN, SiC and Alumina are an example of an insulating ceramic. With heat dissipation in mind, a metal member (copper, aluminum, etc.), an insulating ceramic of a different material, or the like may also be disposed on the lower surface of the first insulating ceramic.

There are no particular restrictions on the thickness of the mounting board 1, but an example is about 0.2 to 5 mm.

The shape or size of the mounting board 1 can be suitably adjusted according to the shape, size, and so forth of the intended semiconductor laser device. Examples of the planar shape include rectangular and other such polyhedral shapes, circular, elliptical, and shapes that are close to these. The mounting board 1 may have concave-convex or the like on its surface, but the surface is preferably flat. An example of the mounting board 1 is a rectangular mounting board 1 in the form of a flat board that measures about 2 to 30 mm along one side.

The mounting board 1 may have a wiring pattern on its surface. Terminals may also be provided for connecting to an external power supply. A wiring pattern or the like may be embedded inside the mounting board 1. The entire rear surface of the mounting board 1 can serve as a heat dissipation surface by providing terminals for connecting to an external power supply on the front of the mounting board 1.

Sub-Mount 3

A sub-mount 3 may be provided on the mounting board 1. The semiconductor laser element 4 here is provided on the sub-mount 3. The sub-mount 3 is formed from a material with good thermal conductivity for the sake of heat dissipation from the semiconductor laser element 4, and may be formed from a material whose thermal conductivity is higher than that of silicon. Examples thereof include AlN, CuW, diamond, SiC, and the like. Among them, the sub-mounts made of a single crystal of AlN or SiC are preferred.

There are no particular restrictions on the thickness of the sub-mount 3, but an example is about 100 to 500 μm, preferably about 120 to 400 μm, and more preferably about 150 to 300 μm. In the case that the sub-mount 3 has at least a certain thickness, light from the semiconductor laser element can be efficiently reflected by the reflecting member and taken off. The thickness of the sub-mount 3 may be enough for the light emission point of the semiconductor laser element to be located higher than the lower end of the reflective film, for example. The height of the semiconductor laser element is preferably such that the desired portion of the light emitted from the semiconductor laser element (the portion of the optical intensity to be reflected) will fit on the reflective film.

There are no particular restrictions on the planar shape of the sub-mount 3, but examples include rectangular and other such polyhedral shapes, circular, elliptical, and shapes that are close to these. The size of the sub-mount 3 can be suitably adjusted to afford good heat dissipation and to match the characteristics of the semiconductor laser device that is ultimately to be obtained. For instance, the sub-mount 3 has a surface area that is greater than the surface area of the semiconductor laser element 4 in plan view. That is, the sub-mount 3 has a length and width that are greater than the length and width of the semiconductor laser element 4 in plan view. This allows all or substantially all of the semiconductor laser element 4 to be disposed on the sub-mount 3, and ensures a heat dissipation path.

Just one sub-mount 3 may be disposed on the mounting board 1, or a plurality of them may be disposed. In the latter case, they are preferably disposed in a matrix, for example.

The sub-mount 3 is usually disposed on the mounting board 1 via the above-mentioned metal layer and/or adhesive member. The metal layer may be disposed on a surface area less than the surface area of the sub-mount 3, or may be disposed on the same surface area. Also, this layer may be disposed sticking out from the edges of the sub-mount 3.

Semiconductor Laser Element 4

The semiconductor laser element 4 has a function that, when voltage is applied and current over a threshold value is supplied, light that has been produced by the active layer and amplified in the light waveguide area within a cavity is released as laser light to the outside. That is, laser generation occurs. This semiconductor laser element 4 can be any known laser element that is configured by laminating a plurality of layers of semiconductor. For example, it can be an element in which an n-type semiconductor layer, an active layer, and a p-type semiconductor layer are laminated in that order over a conductive substrate, and an insulating film, electrodes, and the like are formed on the surface of the semiconductor layer. Group III-V compounds are an example of the material of the semiconductor layer, of which nitride semiconductors are preferable.

The semiconductor laser element 4 is provided on the sub-mount 3. This allows heat generated from the semiconductor laser element 4 to efficiently escape through the sub-mount 3, etc., to the mounting board 1. The semiconductor laser element 4 may be mounted junction up (face up) so that the substrate side is the mounting surface, but is preferably mounted junction down (face down). Junction down mounting allows the site where laser light is generated in the semiconductor laser element 4 to be moved closer to the mounting board 1 and the sub-mount 3 below. Thus disposing the laser light generation site, which is the portion where heat tends to be generated, closer to the mounting board 1 and the sub-mount 3 allows heat to be dissipated more effectively. With junction down mounting, the semiconductor laser element 4 is preferably disposed so that part of it sticks out from the end of the sub-mount 3 to the optical member 15 side. The protrusion length can be about 10 to 20 μm, for example. This reduces the reflection of laser light by the sub-mount, and also shortens the distance between the optical member 15 and the semiconductor laser element 4 in a direction parallel to the surface of the mounting board. That is, the semiconductor laser element 4 can be moved closer to the optical member 15 (discussed below). This further reduces the size of the semiconductor laser device.

Just one semiconductor laser element 4 may be disposed on each sub-mount 3, or a plurality of them may be disposed on one sub-mount 3. The plurality of semiconductor laser elements 4 may all have the same wavelength band, or may have different wavelength bands. These semiconductor laser elements 4 may be installed in a matrix.

Cap

A cap 8 may be attached to the mounting board 1 so as to cover the semiconductor laser element 4 and the optical member 15. The semiconductor laser element 4 is preferably sealed airtight by the cap 8. In particular, when using a semiconductor laser element 4 that makes use of a semiconductor material with an oscillation wavelength of about 300 to 600 nm (such as a nitride semiconductor), organic matter, moisture, and the like will tend to collect, so providing the cap 8 makes the interior of the laser device more airtight, waterproof, and dust-proof. Also, in this case members disposed in the interior that has been made airtight by the cap 8 are preferably members that do not contain any resin or other organic matter.

Examples of the shape of the cap 8 include that of a bottomed cylinder (a circular column, prismatic column, etc.), a truncated cone (a truncated circular cone, truncated pyramid, etc.), a dome, and modified shapes of these. The cap 8 can be formed from nickel, cobalt, iron, Ni—Fe alloys, KOVAR® (nickel-cobalt ferrous alloy), brass, and other such materials. The cap 8 provided to the mounting board I preferably has an opening provided on one surface thereof. A translucent member 7 is provided to this opening. Laser light can be taken off from the translucent member 7. The cap 8 can be fixed to the mounting board 1 by a known method such as welding or soldering.

Lens

A lens serves to make the laser light into parallel light, to focus this light, etc. The lens may be disposed in the forward direction of the laser light reflected by an optical member mirror, or may be disposed between the semiconductor laser element and the optical member at the location illuminated by laser light from the semiconductor laser element.

The lens can be formed from a material that transmits laser light, and any material that is commonly used can be used, such as quartz, sapphire, or plastic. The light taken off from the semiconductor laser device is preferably made into parallel light in order to accommodate various applications. Therefore, in order for the laser light to be emitted as parallel light from the semiconductor laser device, the use of a collimating lens is preferable. There are no particular restrictions on the shape of the lens, but circular or elliptical is preferable. The size of the lens can be determined as needed according to the size and so forth of the laser beam that is emitted.

Embodiment 3: Method for Manufacturing Semiconductor Laser Device

A method for manufacturing a semiconductor laser device of this embodiment includes fixing the optical member and a semiconductor laser element, which are described above, to a mounting board so that laser light emitted from the semiconductor laser element is directed at the reflective film of the optical member.

First the semiconductor laser element may be fixed to the mounting board, and then the optical member fixed so that the laser light emitted from the semiconductor laser element will hit the reflective film of the optical member, or the optical member may be fixed and then the semiconductor laser element fixed so that the laser light will hit the reflective film of the optical member, or both may be fixed at the same time.

Thus fixing the semiconductor laser element and the optical member allows the laser light emitted from the semiconductor laser element to be reflected in a different direction from the direction in which the laser light is emitted.

When the optical member is fixed to the mounting board, the surface of the optical member that is to be opposite the semiconductor laser element is preferably fixed at a 45-degree angle to the mounting board surface. To this end, the surface of the optical member to be opposite the mounting board is preferably the {100} plane of the above-mentioned silicon substrate, for example. This allows the {110} plane, which has not undergone the above-mentioned etching, to serve as the reflecting surface. This {110} plane has no roughness or defects caused by etching, and is therefore more suited to being the reflecting surface. In this case, the {110} plane can be a reflecting surface that is inclined at an angle of 45 degrees to the mounting board surface.

As discussed above, when the optical member is fixed to the mounting board, it is preferably fixed via a metal layer and/or an adhesive member.

When the semiconductor laser element is fixed to the mounting board, it is preferable for the semiconductor laser element to be fixed to a sub-mount, and this sub-mount fixed to the mounting board via a metal layer and/or an adhesive member, or for the sub-mount to be fixed to the mounting board, and the semiconductor laser element to be fixed to the sub-mount. In this case, if the semiconductor laser element is mounted junction down, as discussed above, it is preferable for part of the semiconductor laser element to be disposed more to the optical member side than the end of the sub-mount. The semiconductor laser element, the sub-mount, and the mounting board can be fixed via the above-mentioned metal layer and/or adhesive member.

In the case where the optical member is fixed to the mounting board, after which the semiconductor laser element is fixed to the mounting board, the position of the optical member can be verified as an image with a camera or the like, and the mounting position of the semiconductor laser element can be determined by using the position of the optical member as a reference. This allows the semiconductor laser element and the optical member to be mounted at the proper positions by a simple method.

The p-electrode and n-electrode of the semiconductor laser element are disposed so as to be electrically connected to the anode terminal and the cathode terminal, respectively, of the package that includes the mounting board. For example, after the semiconductor laser element, the sub-mount, and the optical member have been fixed to the mounting board, the electrodes of the semiconductor laser element and the wiring pattern of the sub-mount are electrically connected by wire bonding with the wiring pattern of the mounting board.

When the lens is mounted, positioning and bonding of the lens may be performed as needed. After the mounting position of the lens has been determined, the lens is fixed at the desired position with an epoxy resin, an acrylic resin, or another such UV setting adhesive, thermosetting adhesive, or the like.

In the case where the semiconductor laser device is sealed with a cap, the cap may be bonded to the mounting board by resistance welding, soldering, or the like. This sealing can be performed in dry air, a nitrogen atmosphere, or the like at the dew point minus 10 degrees or less. It is also preferable to pretreat the members by ashing, heat treatment, or another such method to remove the moisture and organic matter that may be adhering to the members.

Examples of the method for manufacturing the optical member, the method for manufacturing the semiconductor laser device, and the semiconductor laser device in the embodiments will now be described in specific terms through reference to the drawings.

EXAMPLE 1

Method for Manufacturing Optical Member a: Preparation of Silicon Substrate

First, a silicon substrate 11 is prepared as shown in FIGS. 1A and 1B. This silicon substrate 11 has a {110} plane at a first main surface 11a and a second main surface 11c. The thickness of the silicon substrate 11 is 500 µm, for example.

b: Formation of Mask Patterns

An SiO₂ film is formed with a CVD apparatus over substantially the entire surface of the first main surface 11a and the second main surface 11c of the silicon substrate 11. A mask-formation pattern having openings in the <100> direction and the <110> direction is then formed by photolithography, and the SiO₂ film is wet etched with buffered hydrofluoric acid. This forms mask patterns 12 having openings 12a and 12b that run in the <100> direction and the <110> direction, respectively. The mask patterns 12 are such that the width Q of each of the openings 12a on the first main surface and the second main surface is 300 µm, and the width Z of each of the openings 12b on the first main surface and the second main surface is 150 µm. The openings 12a on the second main surface side are located directly under the openings 12a on the first main surface side. The direction in which both openings 12a extend, that is, the center lines running along the <100> direction, coincide. The side length X in the <100> direction of each of the mask patterns is 500 µm, and the side length Y in the <110> direction of each of the mask patterns is 700 µm.

c: Formation of Sloped Surfaces

Figure 2A:
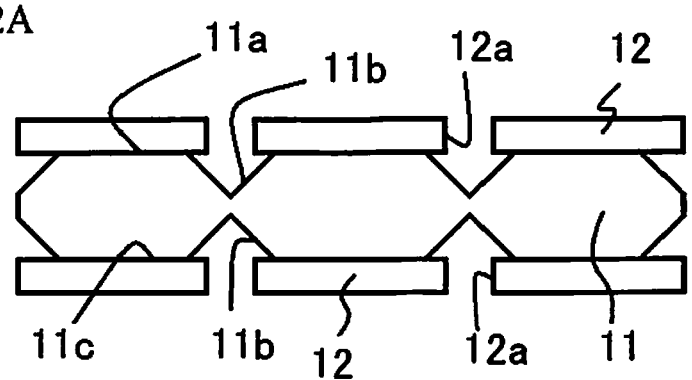
FIGS. 2A to 2D are schematic cross-sectional views illustrating an embodiment of the method for manufacturing an optical member in the present disclosure.

Next, as shown in FIG. 2A, using the mask patterns 12 as masks, the {110} planes, which are the first main surface 11a and the second main surface 11c of the silicon substrate 11, are wet etched for 240 minutes with TMAH at 90 degrees centigrade. This exposes 45-degree sloped surfaces with a depth of approximately 200 µm from the first main surface 11a and the second main surface 11c along the <100> direction. The surfaces opposite these 45-degree sloped surfaces are also 45-degree sloped surfaces, resulting in grooves with a substantially V-shaped cross section. The 45-degree sloped surfaces 11b here are {100} planes. The wet etching is performed to go around and underneath the mask patterns 12 as well.

At the same time, 35-degree sloped surfaces with a depth of approximately 150 µm are exposed from the first main surface 11a along the <110> direction. The surfaces opposite these 35-degree sloped surfaces are also 35-degree sloped surfaces, resulting in grooves with a substantially V-shaped cross section.

Figure 2B:
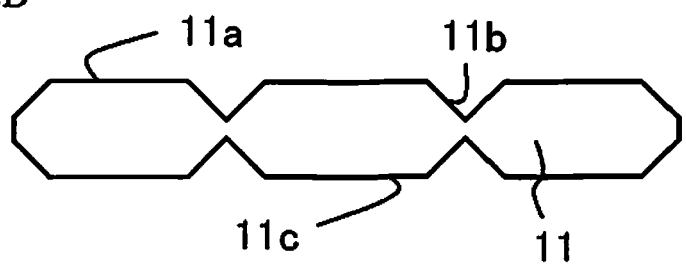

After this, the mask patterns 12 are removed with buffered hydrofluoric acid as shown in FIG. 2B.

d: Formation of Reflective Film

Figure 2C:
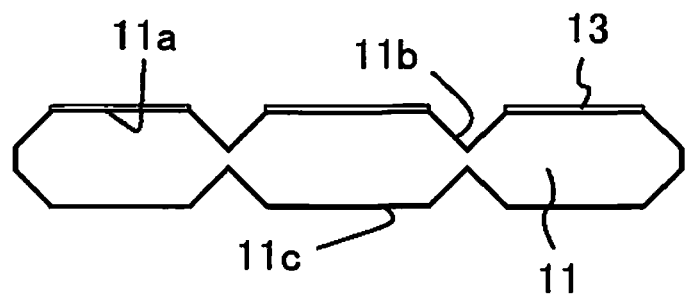

As shown in FIG. 2C, a reflective film 13 is formed on the {110} plane, which is the first main surface 11a, of the silicon substrate 11 thus obtained, by using an ECR apparatus to form an SiO₂ film/ZrO₂ film (75 nm/50 nm) as an eight-pair laminated structure (with a total film thickness of 1000 nm). The reflectivity of this reflective film 13 with respect to light with a wavelength of 430 to 460 nm and an incidence angle of 45 degrees is at least 99%.

e: Division of Silicon Substrate

Figure 2D:
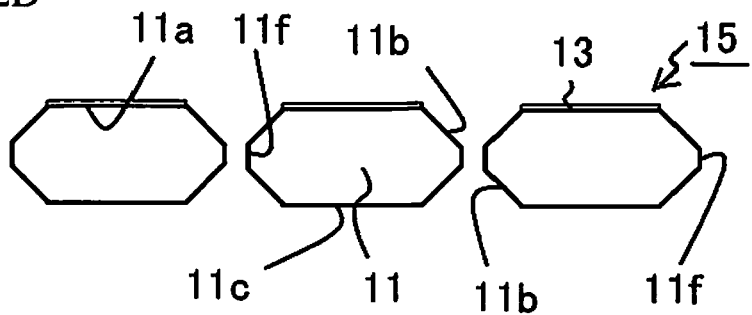

Next, as shown in FIG. 2D, the silicon substrate 11 is divided along the center (the vertex portion of the V shape) of the V-shaped grooves etched in the <100> direction of the silicon substrate 11 to obtain bar-shaped silicon substrates 11 having division surfaces 11f.

Optionally, the silicon substrate 11 is divided along the center (the vertex portion of the V shape) of the V-shaped grooves etched in the <110> direction of the silicon substrate 11 to form optical members 15 from the small pieces of the silicon substrate 11.

This allows an optical member 15 to be formed from a silicon substrate 11 whose planar shape is substantially rectangular. As shown in FIG. 3, this optical member 15 has two kinds of sloped surface, namely, two 45-degree sloped surfaces (that is, 11b {100} planes) and two 35-degree sloped surfaces (that is, 11d), on the first main surface 11a side. The 11b {100} planes are linked to the 35-degree sloped surfaces 11d by curved surfaces 11e that are rounded, or by surfaces with a plurality of orientations in which the inclination angle gradually changes, for example. The same applies to the second main surface side.

EXAMPLE 2

Semiconductor Laser Device

As shown in FIGS. 4A and 4B, the semiconductor laser device 10 in this example mainly has the mounting board 1, the sub-mount 3 provided on the mounting board 1, the semiconductor laser element 4 provided on the sub-mount 3, and the optical member 15. The semiconductor laser element 4 and the optical member 15 are sealed airtight by the cap 8.

The mounting board 1 is constituted by an insulating ceramic board 1a composed of an oblong piece of AlN, and a metal member 1b composed of copper and disposed on the lower surface of this board.

Metal layers 2A and 2B are disposed on the upper surface of the mounting board 1, apart from each other, and at the locations where the semiconductor laser element 4 and the optical member 15 are installed.

The metal layer 2A is created by laminating titanium (0.06 µm) and platinum (0.2 µm) in that order from the mounting board 1 side, and this disposed an Au—Sn-based eutectic solder (3 µm) on this. The metal layer 2B is created by laminating titanium (0.06 µm), platinum (0.2 µm), gold (1 µm), and palladium (0.3 µm) in that order from the mounting board 1 side, and the disposed an Au—Sn-based eutectic solder (3 µm) on this.

The optical member 15 is the optical member 15 obtained in Example 1, and is composed of silicon. The optical member 15 has four {100} planes, which are sloped surfaces 11b that are sloped at 45 degrees to the first main surface 11a and the second main surface 11c. A reflective film 13 having a laminated structure composed of an SiO$_2$ film and a ZrO$_2$ film (75 nm/50 nm) is provided on the first main surface 11a.

The sloped surfaces 11b of the optical member 15 are fixed to the mounting board 1 via the metal layer 2B. The height from the lowermost end to the uppermost end of the optical member 15, that is, the length between the opposing, parallel sloped surfaces 11b, is 1000 µm.

The sub-mount 3 is made of AlN in which titanium (0.06 µm) and platinum (0.2 µm) have been laminated on the rear surface. The sub-mount 3 has a cuboid shape measuring 450 µm×1900 µm×200 µm (thickness).

When the sub-mount 3 is mounted on the mounting board 1, titanium (0.06 µm), platinum (0.2 µm), an Au-Sn-based eutectic solder (3 µm), platinum (0.2 µm), and titanium (0.06 µm) are laminated in that order from the mounting board 1 side, and the mounting is performed with heating.

The semiconductor laser element 4 is disposed on the sub-mount 3 via an Au-Sn-based eutectic solder, for example. The semiconductor laser element 4 is a substantially rectangular element (150×1200 µm) with an oscillation wavelength of 445 nm, formed from a nitride semiconductor.

The end surface of the semiconductor laser element 4 on the optical member 15 side is disposed closer to the optical member 15 than the end surface of the sub-mount 3 on the optical member 15 side. The distance between these end surfaces is 15 µm, for example.

The light emission surface of the semiconductor laser element 4 is opposite the reflecting surface of the optical member 15, and is disposed about 100 µm away.

The cap 8 is fixed on the mounting board 1 so that the semiconductor laser element 4 and the optical member 15 will be sealed airtight. The cap 8 has an opening in its upper surface, and a translucent member 7 made of glass is provided in this opening.

With this semiconductor laser device 10, a reflective film of good film quality is disposed on either the first main surface or the second main surface, which has extremely superior flatness, and this allows a semiconductor laser device with excellent reflection efficiency and durability to be obtained inexpensively.

Furthermore, since a pair of surfaces that are inclined to the first main surface and the second main surface and are parallel to each other are very precisely controlled to be at a 45-degree angle to the first main surface and the second main surface, the optical member 15 can be stably fixed by one of these sloped surfaces. The other sloped surface can be parallel to the mounting board and the semiconductor laser device, that is, can be horizontal, and makes the optical member 15 easier to handle with a suction apparatus or the like, and improves pickup and other aspects of work efficiency.

Also, since the majority of the semiconductor laser element 4 can be disposed on the sub-mount 3, good heat dissipation by the sub-mount 3 can be ensured. Furthermore, since the semiconductor laser element 4 and the optical member 15 can be close together, the beam diameter of the laser light can be kept small, and light of high brightness can be obtained.

EXAMPLE 3

Semiconductor Laser Device

Figure 5:
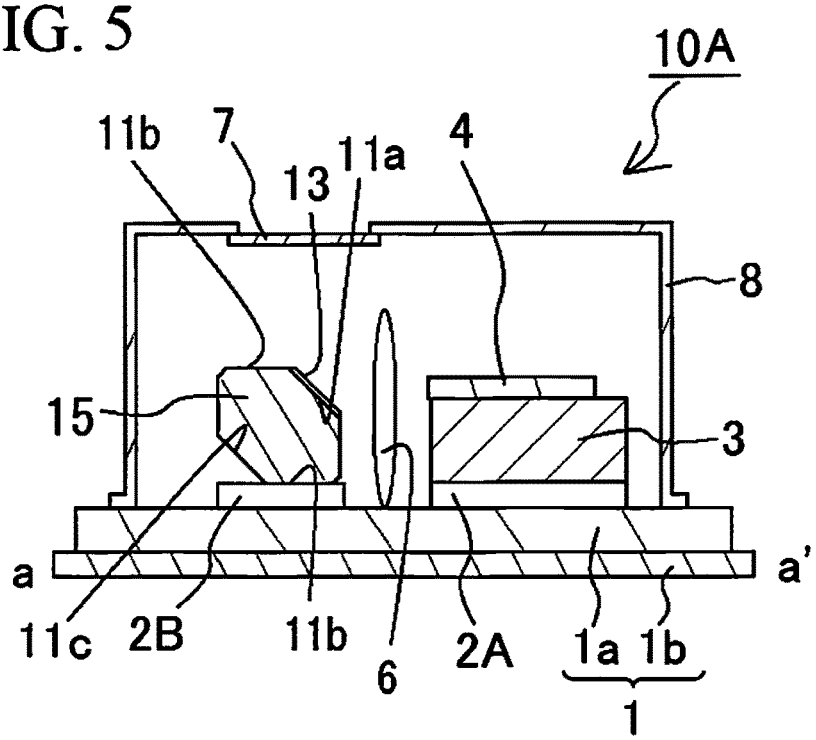
FIG. 5 is a schematic cross sectional view illustrating another embodiment of a semiconductor laser device in the present disclosure.

As shown in FIG. 5, the semiconductor laser device 10A in this example has substantially the same configuration as the semiconductor laser device 10, except that a lens 6 is disposed between the optical member 15 and the semiconductor laser element 4.

The lens 6 functions as a collimating lens for changing the light emitted from the semiconductor laser element 4 into collimated light.

EXAMPLE 4

Method for Manufacturing Optical Member

Figure 6:
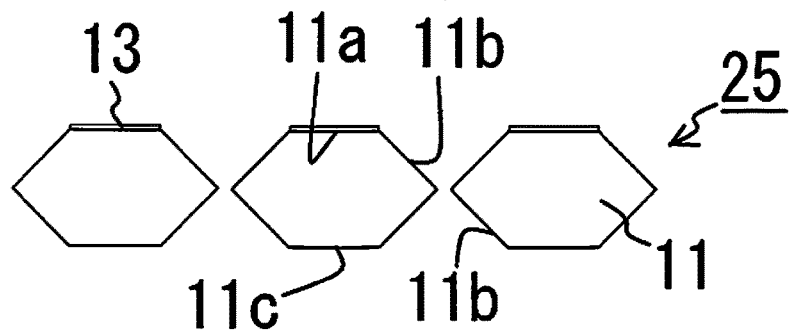
FIG. 6 is a schematic cross-sectional view of an optical member obtained in another method in the present disclosure.

With the method for manufacturing an optical member in this example, an optical member 25 is formed by substantially the same method as in Example 1, except that in the formation of the sloped surfaces by etching, grooves are formed with a substantially V-shaped cross section (see FIG. 2C), after which the etching is allowed to proceed further until the grooves on both the first main surface side and the second main surface side are linked as shown in FIG. 6.

Thus, when the silicon substrate is divided, the division in the <100> direction of the silicon substrate 11 can be omitted, and this simplifies the manufacturing process.

Also, with this optical member 25, in addition to the effect of the optical member discussed above, the surface area of the sloped surfaces 11b can be somewhat larger than with the optical member 15. Thus, the semiconductor laser device can be fixed more stably to the mounting board, the optical member 15 can be handled more easily with a suction apparatus or the like, and pickup and other aspects of work efficiency can be improved.

EXAMPLE 5

Method for Manufacturing Optical Member

Figure 7A:
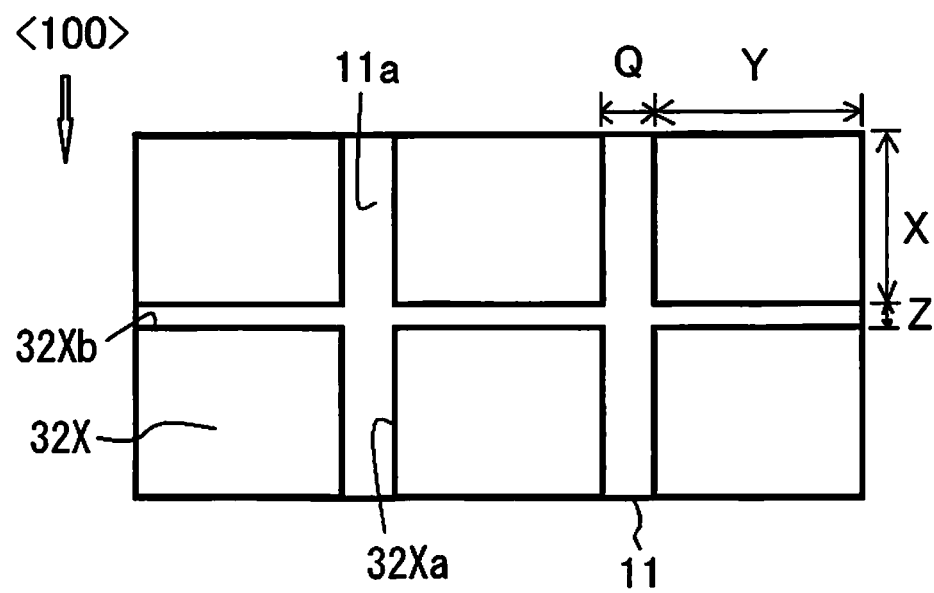
FIG. 7A and FIG. 7B are a schematic plan view and a schematic cross sectional view, respectively, illustrating an embodiment of mask patterns on a silicon substrate in another method for manufacturing an optical member in the present disclosure.
Figure 7B:
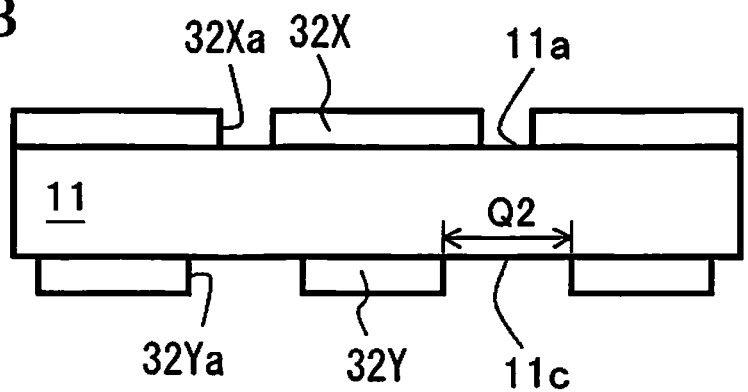

With the method for manufacturing an optical member in this example, the same silicon substrate 11 is provided as in Example 1, and as shown in FIGS. 7A and 7B, mask patterns 32X and 32Y having openings that run along the <100> direction and the <110> direction, respectively, are formed in the first main surface 11a and the second main surface 11c of the silicon substrate 11.

With these mask patterns 32X and 32Y, the widths of openings 32Xa and 32Ya extending in the <100> direction are different. The width Q of each of the openings 32Xa is 250 μm, and the width Q2 of each of the openings 32Ya is 500 μm. The center lines that run along the <100> direction of the openings 32Xa and 32Ya are in mutually coinciding locations.

Figure 7C:
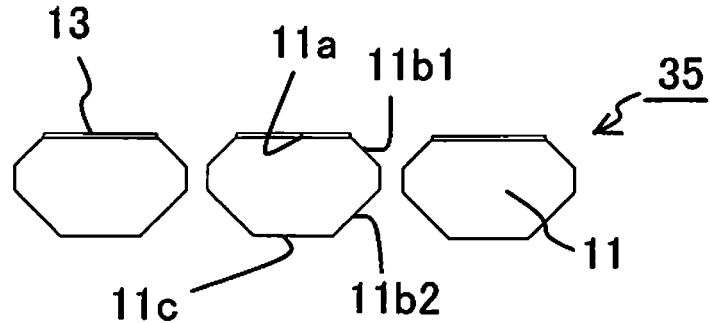
FIG. 7C is a schematic cross sectional view of the optical member thus obtained.

These masks are used to perform etching, the reflective film 13 is formed, and the silicon substrate 11 is divided just as in Example 1, which allows the optical member 35 shown in FIG. 7C to be obtained.

With this optical member 35, in addition to the effect of the optical member discussed above, the surface area of the sloped surfaces 11b1 can be somewhat larger than the surface area of the sloped surfaces 11b2, as compared to the optical member 15. Thus, when the sloped surfaces 11b2 are used to fix the semiconductor laser device to the mounting board, more stable mounting can be achieved.

Alternatively, when the sloped surfaces 11b1 are used to fix the semiconductor laser device to the mounting board, a suction apparatus or the like can be applied to the sloped surfaces 11b2, the optical member 15 can be handled even more easily, and pickup and other aspects of work efficiency can be improved.

EXAMPLE 6

Method for Manufacturing Optical Member

With the method for manufacturing an optical member in this example, the same silicon substrate 11 is provided as in Example 1, and as shown in FIGS. 8A and 8B, mask patterns 42X and 42Y having openings that run along the <100> direction and the <110> direction, respectively, are formed in the first main surface 11a and the second main surface 11c of the silicon substrate 11.

With these mask patterns 42X and 42Y, the widths of openings 42Xa and 42Ya extending in the <100> direction are different, but in a see-through view, the center lines that run along the <100> direction of the openings 42Xa and 42Ya alternate at regular intervals. The pitch of the openings on the first main surface 11a and the second main surface 11c is twice that in Example 1.

These masks are used to perform etching, the reflective film 13 is formed, and the silicon substrate 11 is divided just as in Example 1, which allows the optical member 45 shown in FIG. 8C to be obtained, which also has the division surfaces 11f.

With this optical member 45, in addition to the effect of the optical member discussed above, the surface area accounted for by the sloped surfaces in the first main surface and the second main surface can be reduced, or more specifically, halved, so a larger surface area can be employed for the first main surface and the second main surface that serve as the reflecting surface. Thus, when applied to a semiconductor laser device, a larger mounting margin can be afforded, which makes it simpler to mount to the semiconductor laser device.

EXAMPLE 7

Semiconductor Laser Device

Figure 9:
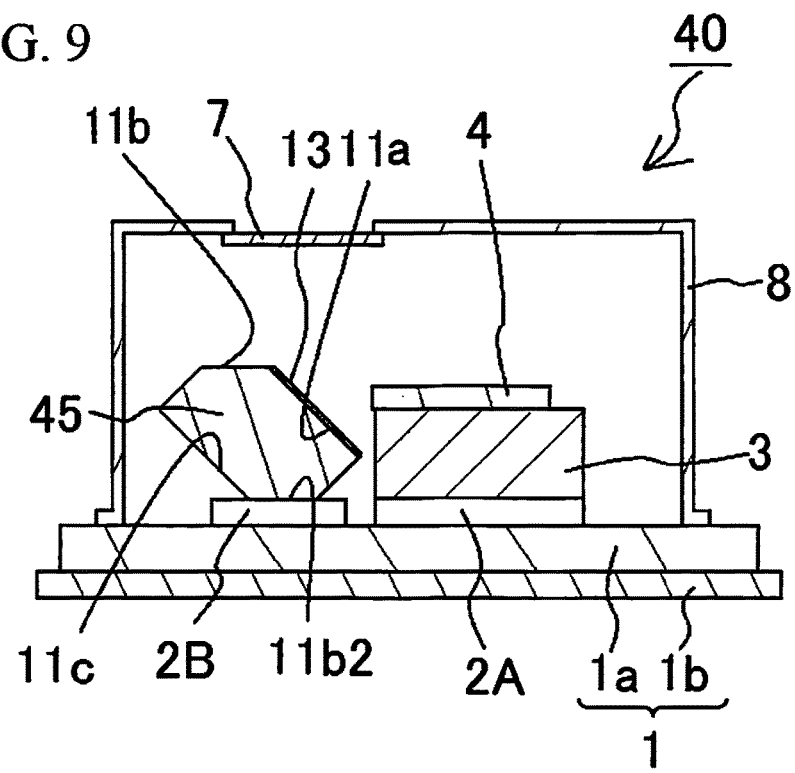
FIG. 9 is a schematic cross sectional view illustrating another embodiment of a semiconductor laser device in the present disclosure.

As shown in FIG. 9, the semiconductor laser device 40 in this example has substantially the same configuration as the semiconductor laser device 10, except that the optical member 45 is used instead of the optical member 15.

With the method in this embodiment, it is easy to provide an optical member that is easy to handle, is inexpensive, is high in quality, and has sloped reflecting surfaces, for a wide range of laser devices, regardless of the shape and size, such as low-cost compact semiconductor laser devices and high-output semiconductor laser devices for which demand has been on the rise in recent years. Furthermore, a semiconductor laser device that makes use of the optical member thus obtained can be provided. In particular, this is suited to a surface mounting type of semiconductor laser device. Also, the semiconductor laser device in this embodiment can be widely applied to optical disks, optical communication systems, projectors, displays, printers, measurement devices, and other such devices.

What is claimed is:

1. A method for manufacturing an optical member comprising:
    providing a silicon substrate having a first main surface of a {110} plane and a second main surface of a {110} plane that are parallel to each other;
    forming mask patterns on the first main surface and the second main surface, each of the mask patterns having an opening extending along a <100> direction, so that the opening on a first main surface side and the opening on a second main surface side are disposed alternately, or so that the opening on the second main surface side are disposed directly under the opening on the first main surface side;
    forming recesses having sloped surfaces of {100} planes in the first main surface side and the second main surface side by wet etching the silicon substrate with an etchant using the mask patterns as masks;
    forming a reflective film on the first main surface or the second main surface; and
    dividing the silicon substrate in the recesses so that a single optical member includes the sloped surface of one of the recesses and the sloped surface of an adjacent one of the recesses after the dividing of the silicon substrate.

2. The method for manufacturing an optical member according to claim 1, wherein
    the dividing of the silicon substrate in the recesses is performed after the forming of the reflective film.

3. The method for manufacturing an optical member according to claim 2, wherein
    the dividing of the silicon substrate includes dividing the silicon substrate from lower ends of the sloped surfaces in the <100>direction, and dividing the silicon substrate in a <110>direction.

4. The method for manufacturing an optical member according to claim 2, wherein
    the forming of the mask patterns includes forming the mask patterns so that the opening on the second main surface side is disposed directly under the opening on the first main surface side.

5. The method for manufacturing an optical member according to claim 4, wherein
    the forming of the mask patterns includes forming the mask patterns so that a center line of the opening along the <100>direction on the first main surface side coincides with a center line of the opening along the <100>direction on the second main surface side in plan view.

6. The method for manufacturing an optical member according to claim 5, wherein
    the dividing of the silicon substrate includes dividing the silicon substrate from lower ends of the sloped surfaces in the <100>direction, and dividing the silicon substrate in a <110>direction.

7. A method for manufacturing a semiconductor laser device comprising
manufacturing an optical member by the method according to claim 6 and
fixing the optical member and a semiconductor laser element to a mounting board so that the first main surface or the second main surface of the optical member intersects an optical axis of laser light emitted from the semiconductor laser and the laser light emitted from the semiconductor laser element is irradiated to the reflective film of the optical member disposed on the first main surface or the second main surface.

8. The method for manufacturing a semiconductor laser device according to claim 7, wherein
the fixing of the optical member includes fixing the optical member to a first surface of the mounting board so that a surface of the optical member on which the reflecting film is arranged forms an angle of 45-degree to the first surface of the mounting board.

9. The method for manufacturing an optical member according to claim 1, wherein
the forming of the mask patterns includes forming the mask patterns so that the opening on the second main surface side is disposed directly under the opening on the first main surface side.

10. The method for manufacturing an optical member according to claim 9, wherein
the forming of the mask patterns includes forming the mask patterns so that a center line of the opening along the <100>direction on the first main surface side coincides with a center line of the opening along the <100>direction on the second main surface side in plan view.

11. A method for manufacturing a semiconductor laser device comprising;
manufacturing an optical member by the method according to claim 1; and
fixing the optical member and a semiconductor laser element to a mounting board so that the first main surface or the second main surface of the optical member intersects an optical axis of laser light emitted from the semiconductor laser and the laser light emitted from the semiconductor laser element is irradiated to the reflective film of the optical member disposed on the first main surface or the second main surface.

12. The method for manufacturing a semiconductor laser device according to claim 11, wherein
the fixing of the optical member includes fixing the optical member to a first surface of the mounting board so that a surface of the optical member on which the reflecting film is arranged forms an angle of 45-degree to the first surface of the mounting board.

13. The method for manufacturing a semiconductor laser device according to claim 11, wherein
an oscillation wavelength of the semiconductor laser element is about 300 to 600 nm.

14. The method for manufacturing an optical member according to claim 1, wherein
the forming of the reflective film includes forming the reflective film having a reflectivity of at least 99% with respect to light with a wavelength of 430 to 460 nm and an incident angle of 45 degree.

15. The method for manufacturing an optical member according to claim 1, wherein
the forming of the recesses includes wet etching the silicon substrate using tetramethylammonium hydroxide (TMAH) as the etchant.

* * * * *